United States Patent [19]

Miyazaki et al.

[11] Patent Number: 5,361,787
[45] Date of Patent: Nov. 8, 1994

[54] CLEANING APPARATUS

[75] Inventors: Takanori Miyazaki; Hiroshi Sakurai, both of Kumamoto, Japan

[73] Assignees: Tokyo Electron Kabushiki Kaisha, Tokyo; Tokyo Electron Saga Kabushiki Kaisha, Saga, both of Japan

[21] Appl. No.: 21,087

[22] Filed: Feb. 23, 1993

[30] Foreign Application Priority Data

Feb. 25, 1992 [JP] Japan ................................ 4-037959
Feb. 25, 1992 [JP] Japan ................................ 4-037960

[51] Int. Cl.$^5$ ............................................ B08B 3/04
[52] U.S. Cl. .................................. 134/57 R; 134/60; 134/104.2; 134/107; 134/902
[58] Field of Search ............ 134/902, 57 R, 60, 104.2, 134/107; 266/88, 112

[56] References Cited

FOREIGN PATENT DOCUMENTS 2-14796  1/1990  Japan .
131015   6/1991  Japan ................................ 134/902
4-5264   1/1992  Japan .

*Primary Examiner*—Philip R. Coe
*Attorney, Agent, or Firm*—Beveridge, DeGrandi, Weilacher & Young

[57] ABSTRACT

The present invention relates to a cleaning apparatus comprising a plurality of processing tanks containing cleaning liquids, a conveyor mechanism for conveying an object to be cleaned and immersing the object to be cleaned into the processing tanks, a dilutent liquid supply device for supplying a dilutent liquid through a piping-system in order to dilute waste liquid from the processing tanks, and a waste liquid sump for collecting diluted waste liquid. The waste liquid sump is provided with a temperature measurement device for detecting the temperature of waste liquid in the waste liquid sump, and the amount of dilutent liquid supplied from the dilutent liquid supply device is controlled by a temperature control device in accordance with a temperature measurement result from the temperature measurement device. The cleaning apparatus is also provided with a fixing device for joints of the piping system. In the cleaning apparatus configured in this way, if damage should occur in a processing tank, the temperature of the waste liquid within the trap tank can be prevented from rising too far before anything damaging occurs. Waste liquid at a high temperature can also be prevented from flowing out from the waste liquid sump into the waste liquid system of the factory, which is intended to improve operating safety in comparison with a conventional cleaning apparatus. The fixing device can also prevent loosening of the joints in the piping caused by pulsations in the piping system.

4 Claims, 14 Drawing Sheets

CLEANING APPARATUS

BACKGROUND OF THE INVENTION

The present invention relates to a cleaning apparatus.

During the conventional process of fabricating a semiconductor device, a cleaning apparatus for cleaning a semiconductor wafer or LCD substrate is used. In a typical example of such a cleaning apparatus, a plurality of processing tanks for cleaning are arranged in a row, and at either end of this row of processing tanks is provided a loader portion and an unloader portion. A conveyor mechanism for passing and conveying the semiconductor wafers between the processing tanks is provided along one side of the row of processing tanks. Semiconductor wafers are removed from wafer carriers in the loader portion and are cleaned by being immersed by the conveyor mechanism into each of the processing tanks in turn. The unloader portion is configured to take the semiconductor wafers from the processing tanks after the cleaning is completed, and store them in wafer carriers.

The processing tanks are filled with distilled water or chemicals for cleaning such as hydrogen peroxide ($H_2O_2$) or sulfuric acid ($H_2SO_4$). If, for example, $H_2SO_4$ is used for cleaning semiconductor wafers, the $H_2SO_4$ is heated to a high temperature such as 150° C. for the cleaning. Therefore, at least the processing tanks containing this chemical are provided with a dilutent liquid supply mechanism that supplies a dilutent (such as water) to dilute and cool the waste liquid expelled from the processing tanks and other parts of the cleaning apparatus, and a waste liquid sump (a trap tank) for temporarily storing this waste liquid. This method of temporarily storing diluted waste liquid in the trap tank, for example, is intended to improve operating safety by allowing the waste liquid to overflow from within this trap tank and drain into the waste liquid system of the factory.

However, in the above-described conventional cleaning apparatus, if, for example, the processing tank that uses high-temperature sulfuric acid for cleaning should be damaged and a large quantity of a chemical such as sulfuric acid at a high temperature should flow into the trap tank, the heat possessed by that chemical and the reaction heat concomitant with the dilution will increase the temperature of the waste liquid in the trap tank. Therefore, high-temperature chemicals will flow out of the trap tank into the factory's waste liquid system, and there is the danger that piping and other parts of the waste liquid system that are made of materials with a low thermal resistance (such as PVC) will be damaged.

This cleaning apparatus also requires piping systems for supplying and carrying away liquids such as processing liquids.

The processing tanks of the cleaning apparatus are provided with supply piping systems that supply the processing tanks with liquids for purposes such as cleaning or rinsing, such as distilled water, hydrogen peroxide ($H_2O_2$), and sulfuric acid ($H_2SO_4$). They are also provided with drainage piping systems that drain these liquids from these tanks or circulation piping systems that circulate the liquids back into the processing tanks via filters, and large numbers of piping joints are used in these piping systems and elsewhere to connect these pipes.

These piping joints are provided with pipe connection portions for connecting pipers to end portions of joint bodies that are configured in straight-through, L-shaped, or T-shaped forms. These pipe connection portions are also configured with pipe-fixing screw portions that are formed as male screw threads. Screw members (female screw threads) on nuts or other tightening devices engage with these pipe-fixing screw portions and are tightened therewith to fix the pipes to the joint bodies.

However, in a cleaning apparatus of this type, vibration of the pumps that are used to circulate the processing and other liquids, or the effects of the temperature or pulsations in the high-temperature processing liquids circulating therein, could loosen the tightening screw parts of the nuts and other parts of the piping joints, and this could result in the processing and other liquids leaking out of the processing tanks.

SUMMARY OF THE INVENTION

In view of the above problems with the conventional cleaning apparatus, the present invention has as an object the provision of a cleaning apparatus that can, if damage should occur in a processing tank, prevent the temperature within the trap tank from rising too far before anything damaging occurs, and can thus prevent chemicals at high temperatures from flowing out from the trap tank into the waste liquid system of the factory, which is intended to improve operating safety in comparison with a conventional cleaning apparatus.

In other words, the cleaning apparatus of the present invention is characterized by a configuration comprising a plurality of processing tanks containing cleaning liquids, a conveyor mechanism for conveying an object to be cleaned and immersing the object to be cleaned into the processing tanks, a dilutent liquid supply means for supplying a dilutent liquid through a piping system in order to dilute waste liquid from the processing tanks, and a waste liquid sump for collecting diluted waste liquid. The waste liquid sump is provided with a temperature measurement means for detecting the temperature of waste liquid in the waste liquid sump, and the amount of dilutent liquid supplied from the dilutent liquid supply means is controlled by a temperature control device in accordance with a temperature measurement result from the temperature measurement means.

Therefore, if damage should occur in a processing tank, such that a large quantity of a chemical such as sulfuric acid at a high temperature flows into the waste liquid sump (trap tank), the temperature measurement means detects the rise in temperature concomitant with this influx of chemicals, and can increase the amount of a dilutent liquid such as water to ensure that the temperature in the trap tank is prevented from rising too far before anything damaging occurs. This ensures that waste liquid at a high temperature can be prevented from flowing out from the trap tank into the waste liquid system of the factory, which is intended to improve operating safety in comparison with a conventional cleaning apparatus.

Another object of the present invention is to provide a cleaning apparatus that is furnished with a fixing device for a piping joint that is intended to solve another problem of the conventional cleaning apparatus and ensure that tightening screw parts of nuts of piping joints are prevented from loosening as an effect of vibration or changes in temperature, and thus prevent processing liquids from leaking.

The fixing device for a piping joint in the cleaning apparatus of the present invention is such that it comprises a joint body having a plurality of pipe connection portions each configured of a screw portion for connecting a pipe body used in a piping system of the cleaning apparatus, and a screw member that is configured with a holding portion formed on an outer surface portion thereof and which engages with the pipe connection portion and fixes the pipe body. The fixing device for a piping joint is configured such that it fits over the holding portion of the screw member so as to support the screw member and thus restrain loosening of the screw member.

Therefore, by applying the fixing device of the present invention to the piping joints of a cleaning apparatus, the tightening screw members of the nuts or the like of the piping joints can be simply and securely prevented from loosening from the effects of vibration and changes in temperature, and thus leakage of processing liquids can be prevented before it happens.

DETAILED DESCRIPTION OF THE PREFERRED EMBODIMENTS

Embodiments of parts of the dilutent supply volume control device of the waste liquid collector of the cleaning apparatus of the present invention will be described below, with reference to the accompanying drawings.

Figure 1:
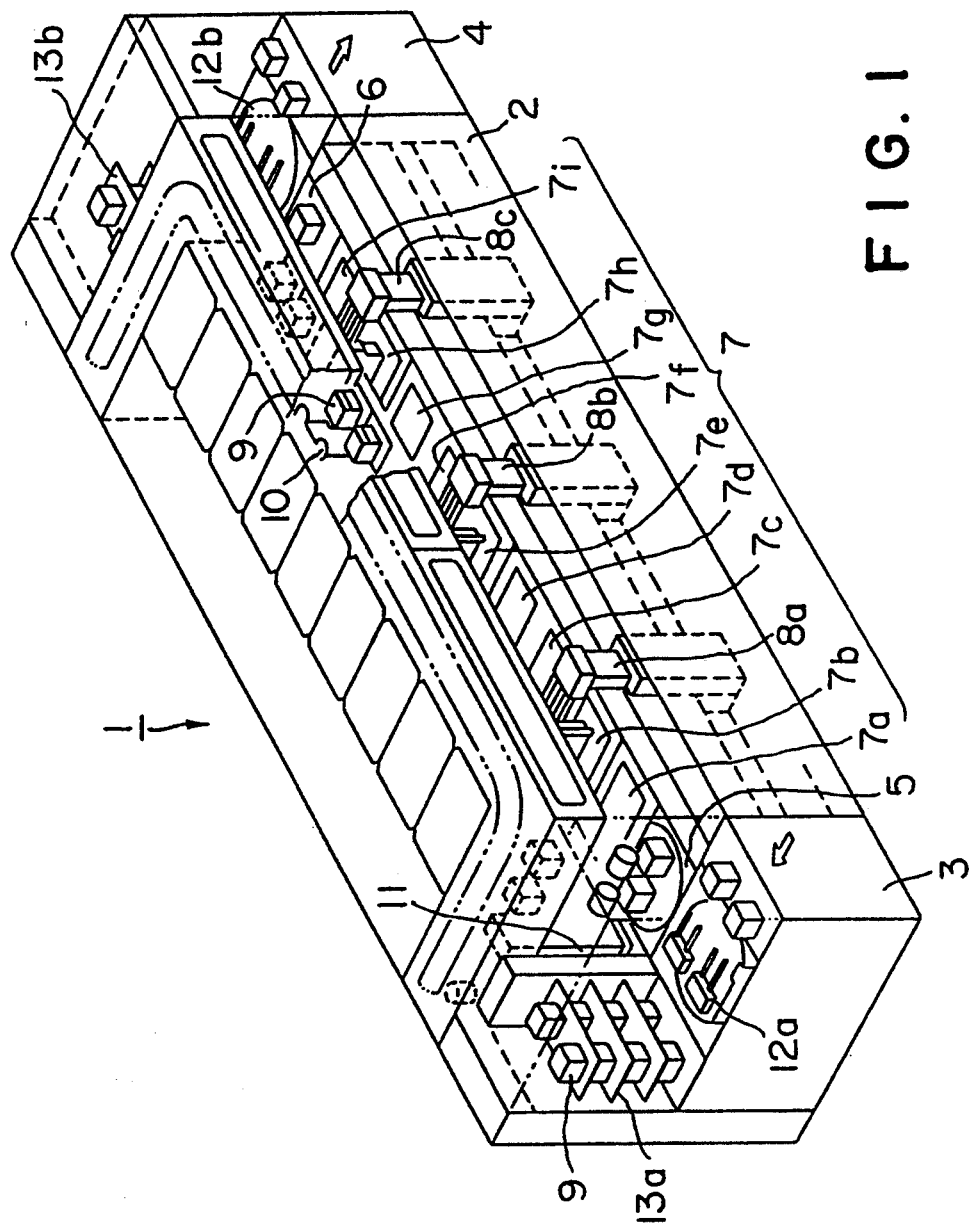
FIG. 1 is a diagram of the complete structure of one embodiment of the cleaning apparatus of the present invention.

As shown in FIG. 1, a cleaning apparatus 1 of one embodiment of the present invention comprises a cleaning apparatus body 2, an input buffer mechanism 3 provided at one end of the cleaning apparatus body 2, and an output buffer mechanism 4 provided at the other end thereof.

A loader portion 5 is placed at one end of the cleaning apparatus body 2, an unloader portion 6 is placed at the other end thereof, and a plurality of processing tanks 7 constructed of a material such as quartz is arrayed in a single row therebetween. In this embodiment, the arrangement is such that nine processing tanks 7 (numbered 7a to 7i) are provided, in an arrangement such that they are, in sequence from the loader portion 5 end: a processing tank 7a for washing and drying a wafer-grasping mechanism of a conveyor mechanism 8, a processing tank for a chemical 7b, a processing tank for water washing 7c, a processing tank for water washing 7d, a processing tank for a chemical 7e, a processing tank for water washing 7f, a processing tank for water washing 7g, a processing tank 7h for washing and drying the wafer-grasping mechanism, and a processing tank 7i for drying wafers. The arrangement is such that semiconductor wafers W (see FIG. 2) are placed in racks (not shown in the drawings) within these processing tanks.

Alongside these processing tanks 7a to 7i is provided the conveyor mechanism 8 that uses the wafer-grasping mechanism to grasp a plurality (such as 50) of semiconductor wafers and convey these semiconductor wafers vertically and horizontally along the row of processing tanks 7. In this embodiment, three units of the conveyor mechanism 8 (8a to 8c) are provided, to ensure that limits in their respective ranges of conveying keep the chemical that is in the processing tank for a chemical 7b, for example, separate from that in the processing tank for a chemical 7e, so that the two chemicals do not mix together.

In addition, a carrier conveyor mechanism 10 for carrying empty wafer carriers 9 is provided in such a manner as to lead from the upper part of the loader portion 5, through the upper part of each conveyor mechanism 8 (8a to 8c), to the upper part of the unloader portion 6. Each of the loader portion 5 and unloader portion 6 is provided with a carrier lifter 11 for raising or lowering the empty wafer carriers 9 (the carrier lifter 11 on the unloader portion 6 side is not shown in the figure).

Similarly, each of the input buffer mechanism 3 and the output buffer mechanism 4 is provided with a carrier conveyor arm 12 (12a and 12b, respectively) for conveying the wafer carriers 9, and a carrier storage mechanism 13 (13a and 13b, respectively) for temporarily storing the wafer carriers 9. The input buffer mechanism 3 and output buffer mechanism 4 act as buffer mechanisms for preprocessing and postprocessing steps before and after the main cleaning process, as described below.

The input buffer mechanism 3 uses the carrier conveyor arm 12a to store wafer carriers 9 that are conveyed by a conveyor robot arm or the like from a preprocessing step of the cleaning process into the carrier storage mechanism 13a, where they are made to wait temporarily until the cleaning process is performed thereon. Similarly, the output buffer mechanism 4 makes wafer carriers 9 containing semiconductor wafers that have undergone the cleaning process wait temporarily before conveying them to the postprocessing step. Note that empty wafer carriers 9 can also be stored within these carrier storage mechanisms 13.

When the cleaning processing is performed, first the carrier conveyor arm 12 of the input buffer mechanism 3 mounts one or two of the wafer carriers 9 into the loader portion 5. After the orientation flats of the semiconductor wafers in the wafer carriers 9 have been aligned by the loader portion 5, these semiconductor wafers are pushed upward from below and are passed on to the conveyor mechanism 8. Note that, at this point, the wafer-grasping mechanism of the conveyor mechanism 8 has previously been washed and dried in the processing tank 7a for washing and drying the wafer-grasping mechanism. Then these semiconductor wafers are conveyed by the conveyor mechanism 8 in sequence through the processing tank for a chemical 7b, the processing tank for water washing 7c, the processing tank for water washing 7d, the processing tank for a chemical 7e, the processing tank for water washing 7f, the processing tank for water washing 7g, and the processing tank 7i for drying wafers, so that the semiconductor wafers are subjected to a washing process in the sequence of: chemical processing, two washes in water, chemical processing, two washes in water, and finally drying. Then the semiconductor wafers that have completed the cleaning process are stored by the unloader portion 6 in wafer carriers 9 conveyed by the carrier conveyor mechanism 10.

The side of the processing tanks 7 opposite to the conveyor mechanism 8 is provided with a circulation mechanism (shown in FIG. 5 and described below) for passing the chemical from within each of the processing tanks 7 through filters and circulating it back into that processing tank 7. A tank 15 which is provided with liquid level meters 15a and 15b (shown in FIG. 2) and which collects a chemical supplied from the supply system within the factory is provided in the upper part of the circulation mechanism. The lower part of each processing tank 7 is provided with a chemical receptacle 16 for collecting any of the chemical that might leak out of the processing tank 7 if the quartz processing tank 7 should be damaged, and a waste liquid sump (trap tank) 17 is provided below the circulation mechanism, at a position even further below the chemical collector 16.

Figure 2:
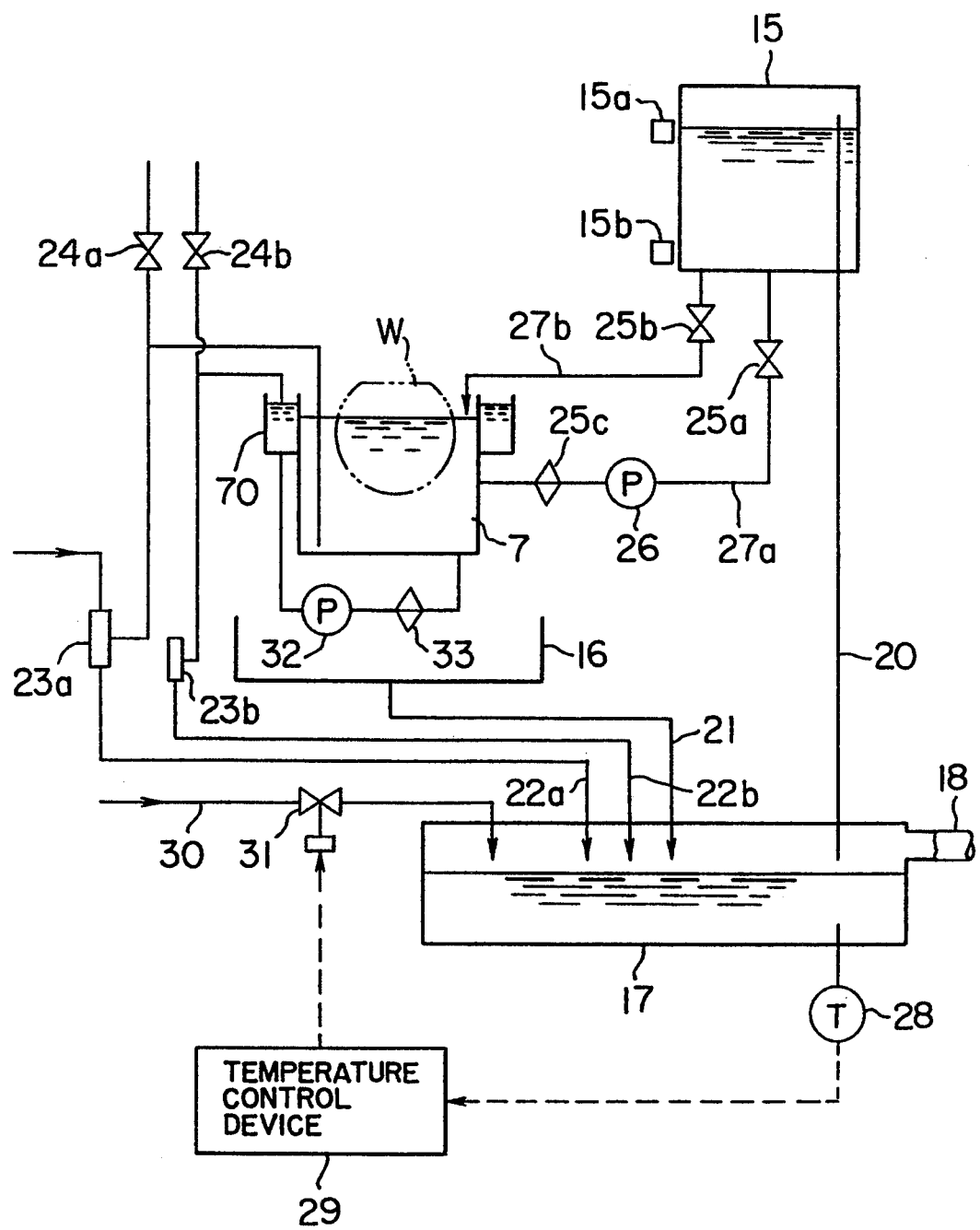
FIG. 2 is an idealized structural diagram of one embodiment of the piping system of the cleaning apparatus of FIG. 1.

The trap tank 17 is, as shown in FIG. 2, connected to piping such as overflow piping 20 from the tank 15, drain piping 21 from the chemical receptacle 16, and drainage piping 22b from the processing tank 7 for semiconductor wafers W, and collects chemicals flowing from each of these parts, until they overflow and flow into the waste liquid system within the factory from drainage piping 18. This ensures that a chemical such as sulfuric acid ($H_2SO_4$) that is highly concentrated or is at a high temperature is prevented from flowing directly into the waste liquid system within the factory. In addition, the configuration is such that, during the normal cleaning processing, a chemical overflowing from one of the processing tanks 7 into an overflow tank 70 is circulated back into the processing tank 7 through the medium of a pump 32 and filter 33, and is also sucked up by an aspirator (siphon) 23b (described below) to be introduced into the trap tank 17.

Aspirators 23a and 23b are provided in drainage piping 22b and 23b of each processing tank 7, and the configuration is such that a chemical in the processing tank 7 is sucked up by the siphon action of the flow of a dilutent such as water supplied to the aspirators 23a and 23b, and is diluted and introduced into the trap tank 17. The relationship between the flow quantity of the dilutent water of the aspirator 23a and that of the entrained chemical is set to a ratio such that the chemical is diluted and cooled sufficiently by the dilutent.

Note that valves 24a and 24b are inserted in the drainage piping 22a and 22b, and chemical supply piping 27a (into which a valve 25a, a filter 25c, and a pump 26 are inserted) and chemical supply piping 27b (with a valve 25b therein) are provided between the tank 15 and the processing tank 7. A temperature control mechanism (not shown in the figure) is also provided in each processing tank 7 to heat the chemical in that processing tank 7 to a prescribed temperature.

In this embodiment of the present invention, a temperature detection sensor 28 acting as a temperature control means for detecting the temperature of the chemical in the trap tank 17 is provided in at least one part of the trap tank 17, such as toward the drainage piping 18 side of the base thereof. A temperature measurement signal of this temperature detection sensor 28 is input to a temperature control device 29. The temperature control device 29 adjusts the degree of opening of a flow quantity control valve 31 inserted in dilutent water supply piping 30 for supplying dilutent water to the trap tank 17, in accordance with the temperature measurement signal from the temperature detection sensor 28, to provide control in such a manner that the temperature within the trap tank 17 does not rise above a previously set temperature (such as 50° C.).

Therefore, if for some reason one of the processing tanks 7 should be damaged during the cleaning processing while sulfuric acid ($H_2SO_4$) at a high temperature such as 150° C. is stored in the processing tank 7, and a large quantity of hot, highly concentrated $H_2SO_4$ should flow into the trap tank 17 from the chemical receptacle 16, the concomitant rise in temperature within the trap tank 17 is detected by the temperature detection sensor 28. The flow quantity control valve 31 is opened by the temperature control device 29 and dilutent water is supplied from the dilutent water supply piping 30 into the trap tank 17, so that high-temperature chemicals can be prevented from flowing out from the drainage piping 18 into the waste liquid system within the factory. This can ensure that the piping and other parts of the waste liquid system in the factory, which are made of a plastic such as PVC, are prevented from damage caused by hot, highly concentrated chemicals, before such damage can occur.

Even in normal operation when no incident such as that described above has happened, if the temperature within the trap tank 17 rises, dilutent water is supplied from the dilutent water supply piping 30 into the trap tank 17 to ensure that the temperature in the trap tank 17 is lowered, which is intended to further improve operating safety. Therefore, even when devices such as the above-described aspirators 23 are used, there is no need to set the proportions of the flow quantity of the dilutent water and that of the entrained chemical to too far over toward the side of safety, and thus the amount of waste liquid can be reduced.

Figure 3A:
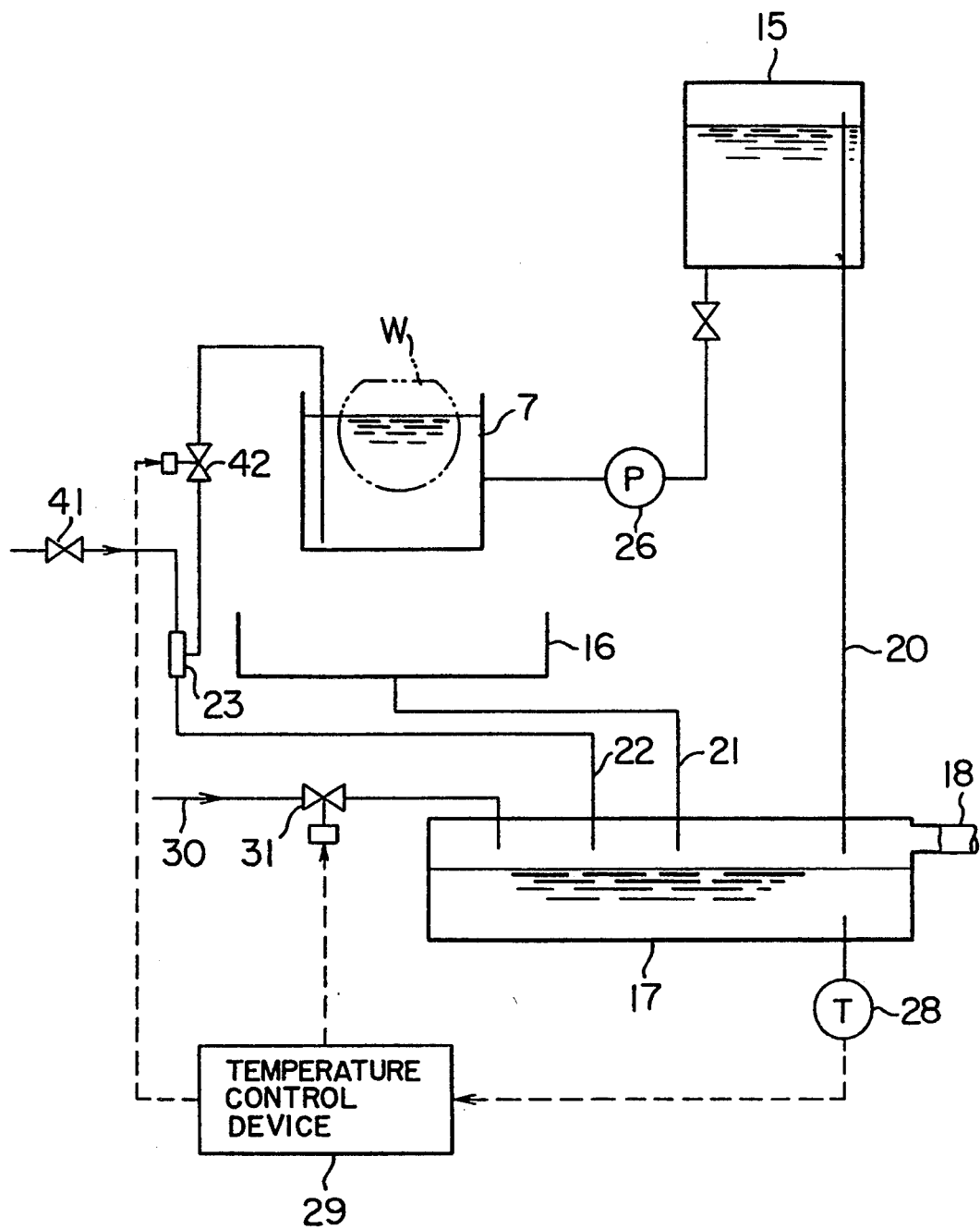
FIGS. 3A and 3B are idealized structural diagrams of another embodiment of each piping system.

As shown in FIG. 3A, a flow quantity control valve 42 and an aspirator valve 41 are inserted into the drainage piping 22a, the opening and closing of the flow quantity control valve 42 is controlled by the temperature control device 29 in accordance with the temperature within the trap tank 17 as measured by the temperature detection sensor 28, and thus the amount of chemical entrained by the aspirator 23 is regulated.

In this case, if the temperature of the dilutent water is low, a comparatively small quantity of dilutent water can be used to lower the temperature of the chemical, so the flow quantity control valve 42 is opened. Conversely, if the temperature of the dilutent water is high, the flow quantity control valve 42 is closed. In either case, the operating safety can be guaranteed and, at the same time, chemicals such as $H_2SO_4$ can be released efficiently from the processing tank 7. Note that the $H_2SO_4$ is renewed after between, for example, 150 and 200 semiconductor wafers have been cleaned (if 50 wafers are cleaned at a time, this is after the third or fourth cleaning cycle), so that the frequency with which such liquid is expelled is fairly high.

Figure 3B:
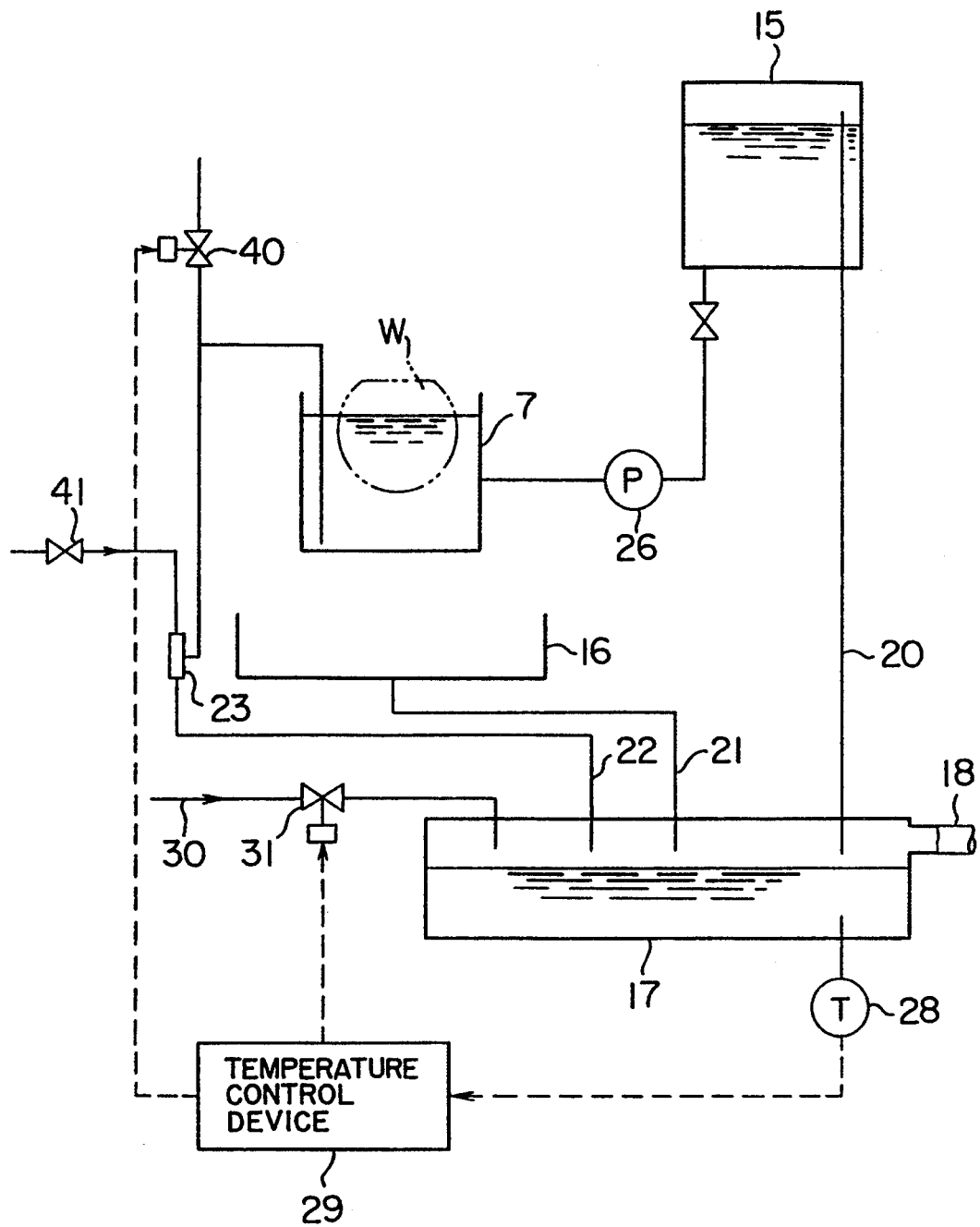

The operation of the control system of the waste liquid piping system of the cleaning apparatus of the present invention will now be described with reference to FIGS. 3B and 4. Here, explanations will be made with respect to an embodiment wherein the flow quantity control valve 42 above is replaced by a breather valve 40.

Figure 4A:
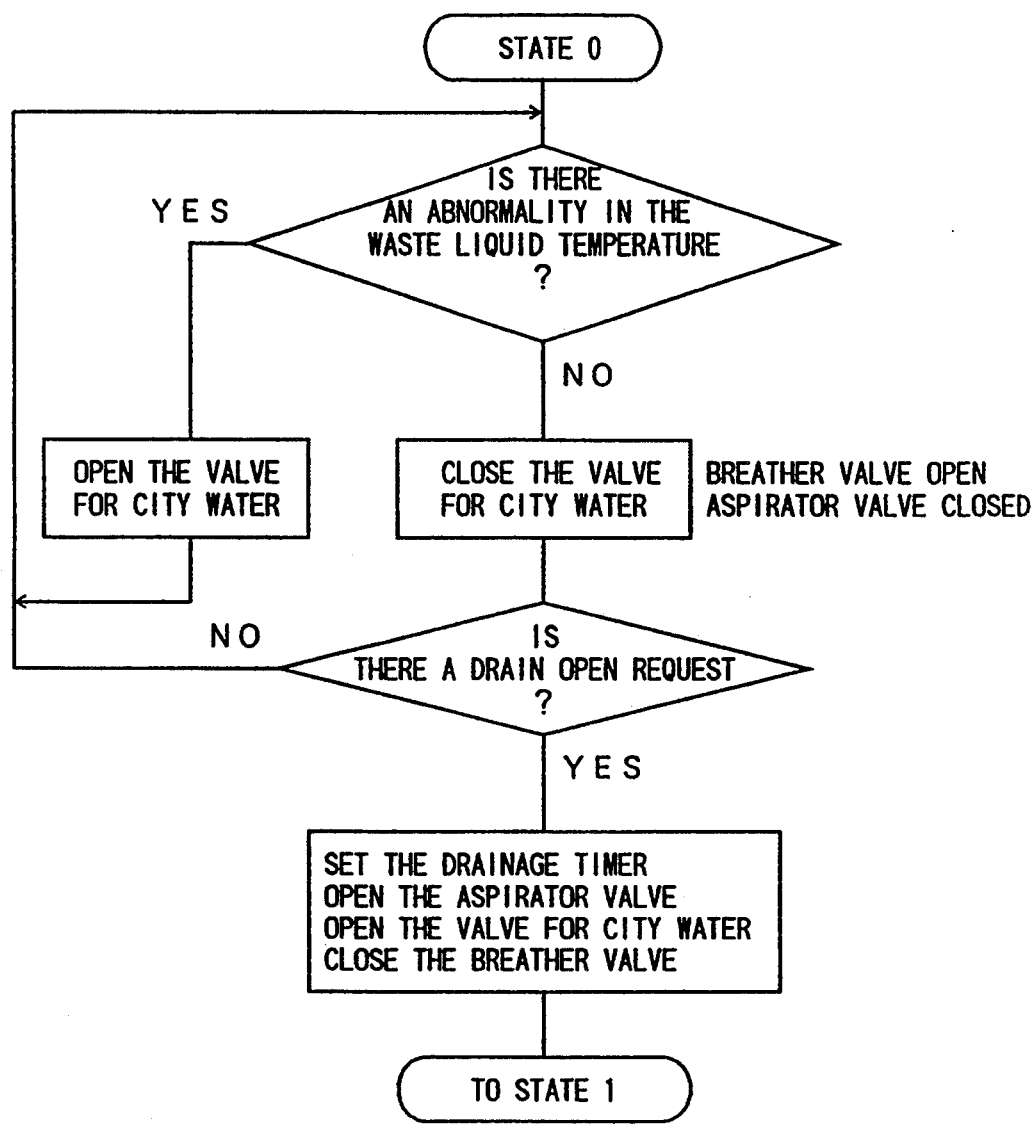
FIGS. 4A to 4E are control flow charts of the waste liquid piping system of the cleaning apparatus shown in FIG. 2.

First, as shown in FIG. 4A, the control system is in a state 0 where it is monitoring the waste liquid temperature and waiting for a drain open request. If an abnormality occurs in the water liquid temperature, the temperature control device 29 opens the flow quantity control valve 31 (hereinafter called the valve for city water, see FIG. 3). If there is no abnormality, it closes the valve for city water 31, opens the breather valve 40 and closes the aspirator valve 41. At this point, the open/closed status of the water stop valve is maintained and controlled, so it does not keep on opening and closing. If a drain open request arrives at this point, the system goes to a state 1 in which a drainage timer is set, the aspirator valve 41 and valve for city water 31 are opened, and the breather valve 40 is closed. In this case, the drainage time can be set to any desired value, and the aspirator drive valve is normally closed, the cooling valve for the trap tank 17 is normally closed, and the atmospheric release valve is normally open.

Figure 4B:
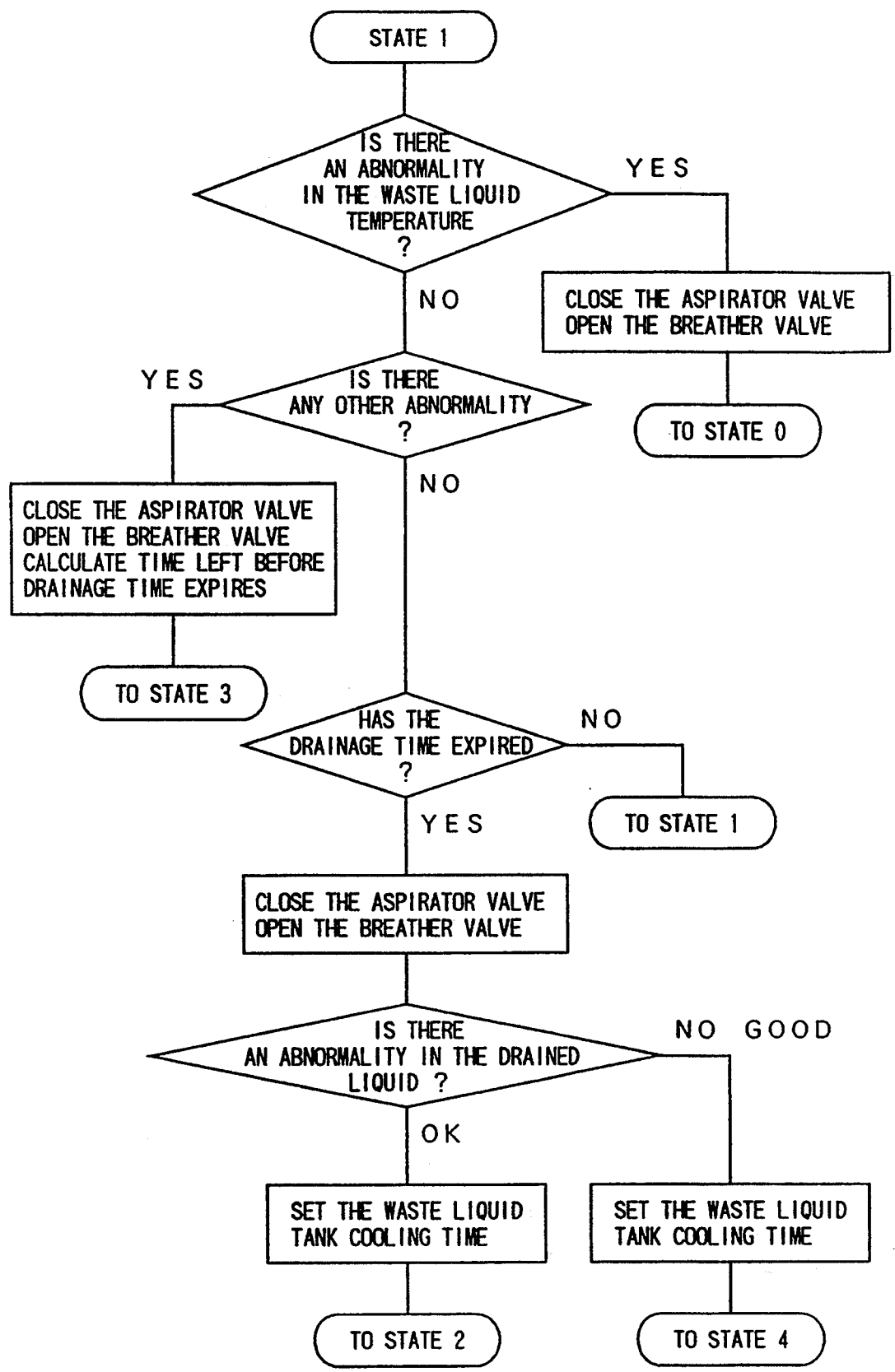

As shown in FIG. 4B, if an abnormality should occur in the waste liquid temperature while the system is in state 1 where it is monitoring for abnormalities during drainage and is waiting for the drainage time to expire, the aspirator valve 41 closes, the breather valve 40 opens, and the system returns to state 0. If there is no abnormality in the waste liquid temperature, the system checks for any other abnormality (such as in air pressure, nitrogen pressure, water leakage, drain pressure, or fan) and, if there is such an abnormality, it closes the aspirator valve 41 and opens the breather valve 40. It then calculates the amount of time left before the drainage time expires and goes to a state 3. If there is no other abnormality, the system checks whether the drainage time has expired and, if this time has not expired, it returns to state 1. If the drainage time has expired, it closes the aspirator valve 41 and opens the breather valve 40. It then checks the drained liquid. If there is no abnormality in the drainage liquid, it sets the cooling time for the trap tank 17 (the time required for cooling with the valve for city water 31 open, after the drainage is completed) and goes to a state 2. If an abnormality is detected in the drainage liquid as a result of this check, it sets the waste liquid tank cooling time (and at this point it also checks that the drainage operation has completed), and goes to state 4.

Figure 4C:
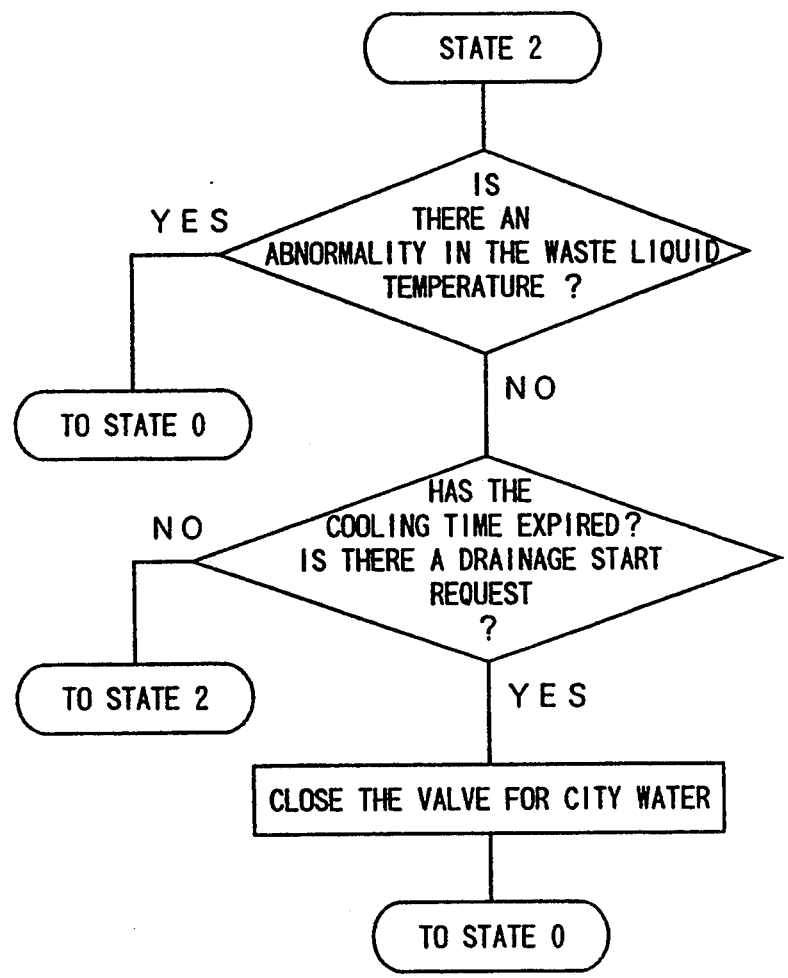

As shown in FIG. 4C, in state 2, the system is waiting for the waste liquid tank cooling time to expire and also for a drainage start request. If an abnormality is detected in the waste liquid temperature, the system goes to state 0. If no abnormality is detected, it checks whether the cooling time has expired and also whether there is a drainage start request. If the time has not expired and there is no such request, it goes to state 2; otherwise it closes the valve for city water 31 and returns to state 0.

Figure 4D:
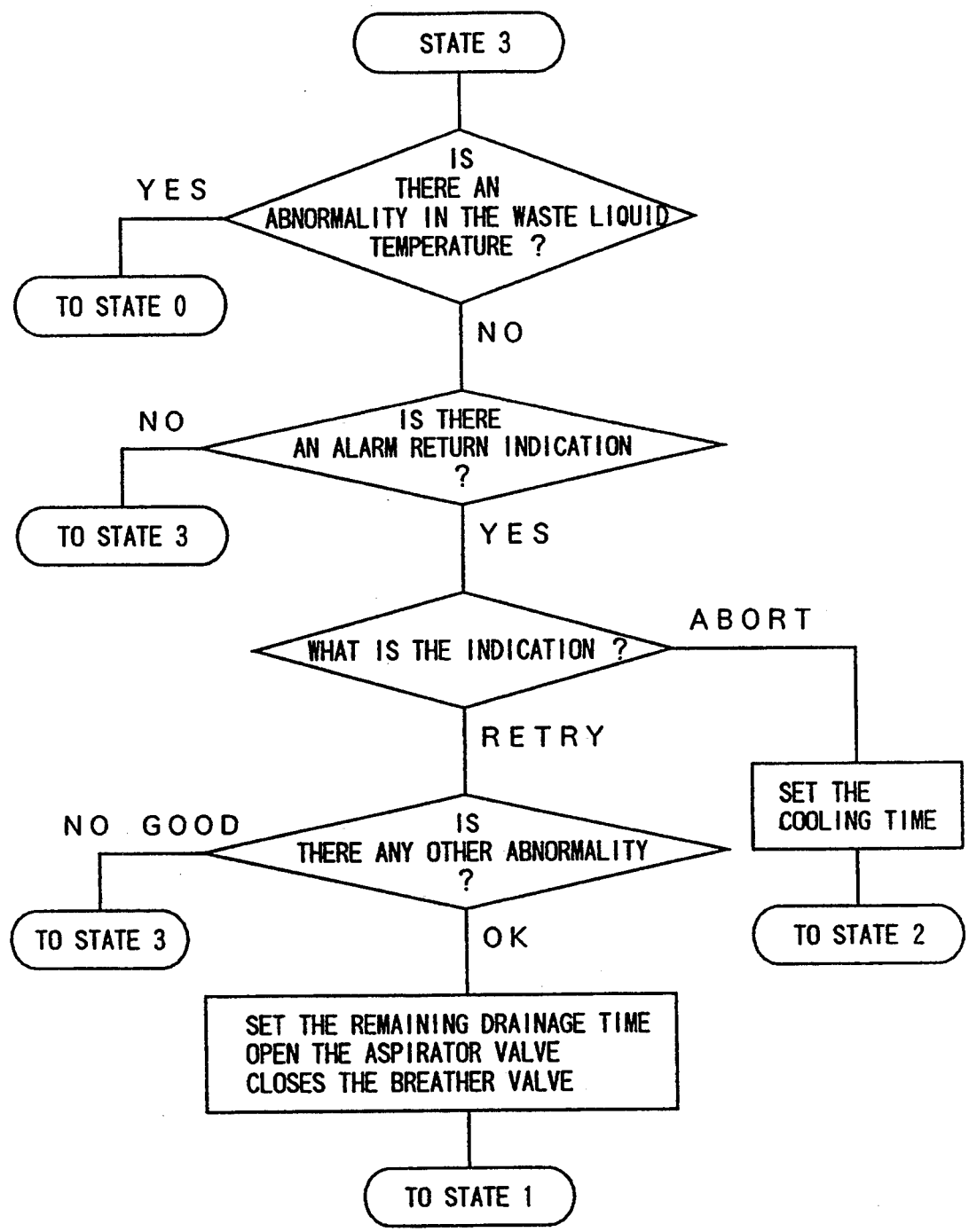

If an abnormality occurs in the waste liquid temperature while the system is waiting for an alarm return indication after another abnormality has occurred (state 3), as shown in FIG. 4D, it goes to state 0. If there is no abnormality and the subsequent alarm return indication check is also negative, it goes to state 3. If there is an alarm return indication, it checks the type of indication. If it is abort, it sets the cooling time and goes to state 2; if it is retry, it once again checks for abnormalities and, if there is still an abnormality, it goes to state 3. If there is no abnormality, it sets the time remaining of the drainage time, opens the aspirator valve 41, closes the breather valve 40, and returns to state 1.

Figure 4E:
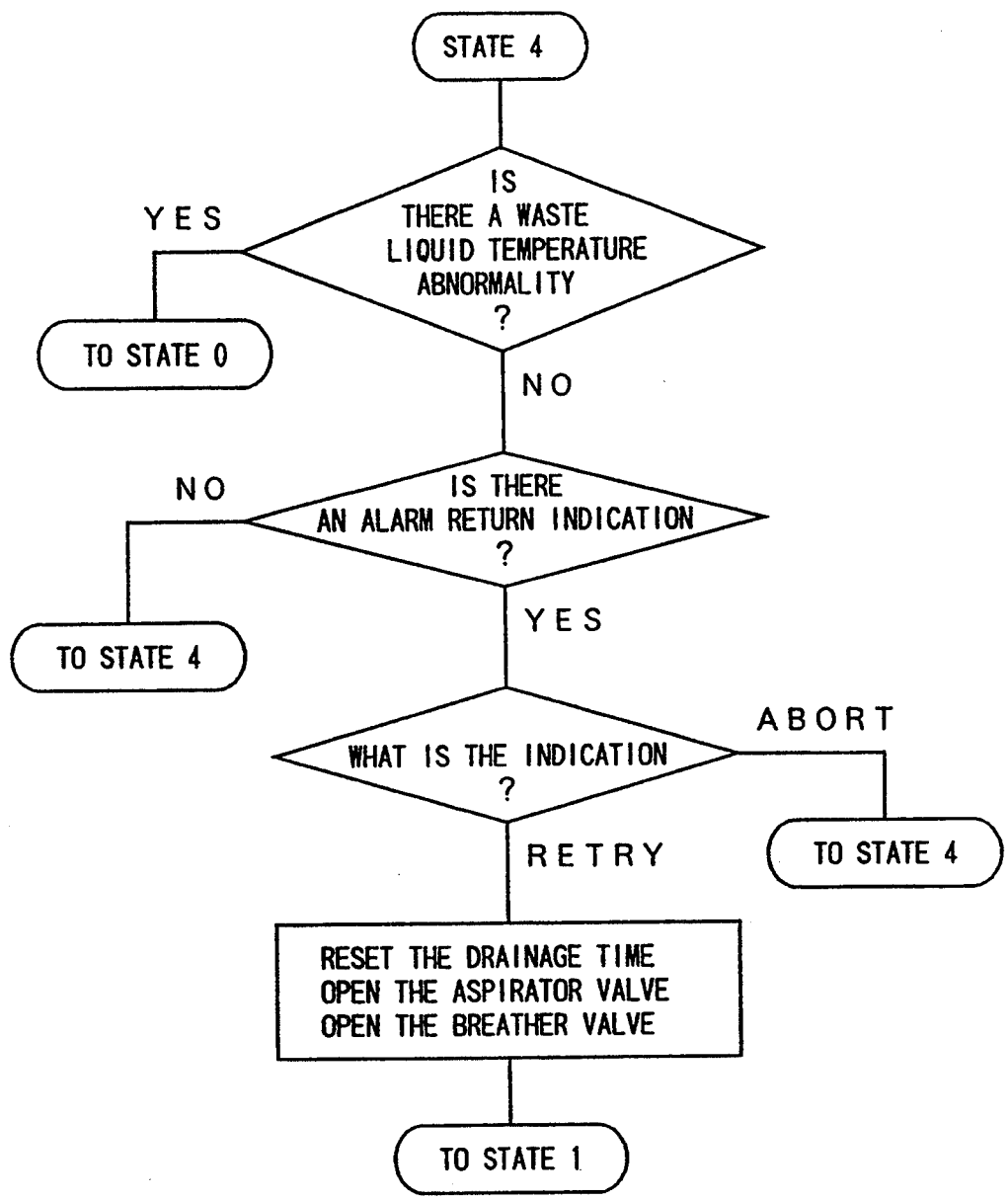

Finally, when the system is in state 4, as shown in FIG. 4E, waiting for an alarm return indication after the drainage liquid has been found to have an abnormality, it returns to state 0 if a waste liquid temperature abnormality has been detected. If no such abnormality is detected, it moves on to determining whether there is an alarm return indication. If there is no such indication, it returns to state 4; if there is an indication, it waits for it. If the indication is abort, it returns to state 4; if it is retry, it sets the drainage time, opens the aspirator valve 41, closes the breather valve 40, and returns to state 1.

As described above, if damage should occur one of the processing tanks 7, the cleaning apparatus of this embodiment can prevent the temperature within the trap tank 17 from rising too far before anything damaging occurs, and can thus prevent chemicals at high temperatures from flowing out from the trap tank 17 into the waste liquid system of the factory, which is intended to improve operating safety in comparison with a conventional cleaning apparatus.

Note that in the above embodiment, the description dealt with the case of diluting sulfuric acid ($H_2SO_4$) with water, but it will be obvious to those skilled in the art that this embodiment is also applicable to other chemicals and other dilutents.

As described above, if damage should occur in a processing tank, the cleaning apparatus of the present invention can prevent the temperature within the trap tank from rising too far before anything damaging occurs, and can thus prevent chemicals at high temperatures from flowing out from the trap tank into the waste liquid system of the factory, which is intended to improve operating safety in comparison with a conventional cleaning apparatus.

Next, embodiments of fixing devices for piping joints of the cleaning apparatus of the present invention will be described below with reference to the accompanying diagrams.

Figure 5:
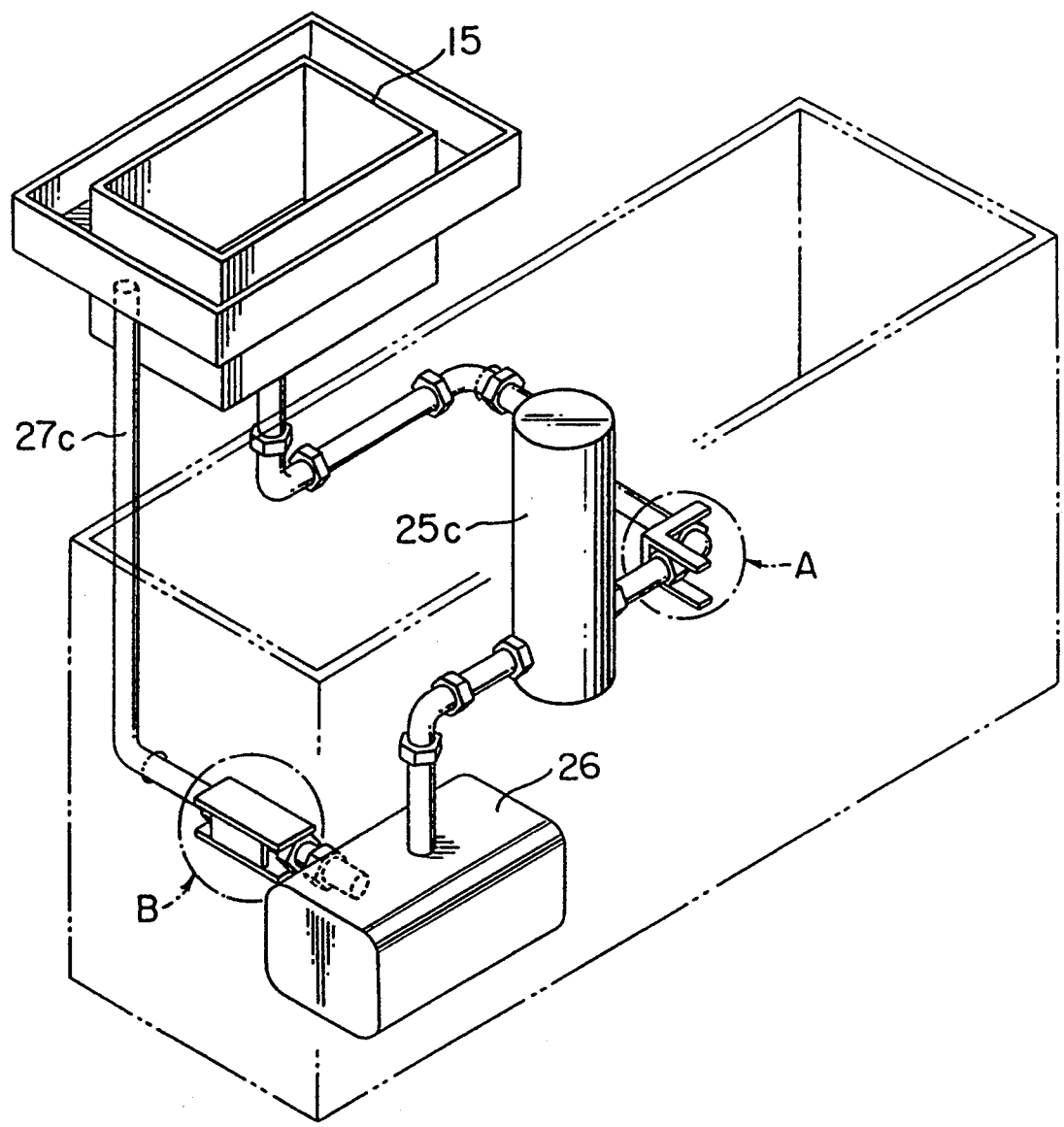
FIG. 5 is a rough sketch indicating places where the fixing device for a piping joint used in the cleaning apparatus of the present invention is positioned.

The fixing device for a piping joint of the cleaning apparatus of the present invention is used in piping systems when pulsations are likely to occur, such as in the processing liquid supply piping system, the drain piping system, and the circulation piping system. For example, it is used as shown in FIG. 5, at portions A and B in a pipeline 27c comprising a chemical tank 15, a pump 26, and a filter 25c, to prevent any loosening of fastenings at those portions caused by pulsations. It can also be used in the circulation pipeline comprising the processing tank 7, overflow tank 70, pump 32, and filter 33 shown in FIG. 2.

Figure 6:
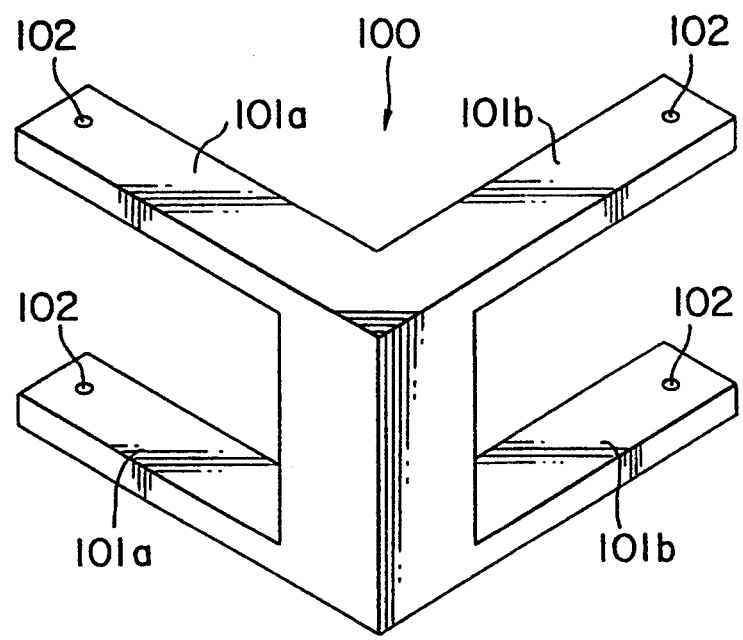
FIG. 6 is a perspective view of a first embodiment of the fixing device for a piping joint of FIG. 5.

A fixing device 100 for a piping joint is constructed of a plastic material that is highly chemical-resistant, such as Teflon (tradename), and is configured of two holder portions 101a and 101b that each have an approximately U-shaped cross-section with flat surfaces on the inner sides thereof, the holder portions 101a and 101b being approximately perpendicular to each other, as shown in FIG. 6. Through holes 102 are provided at the ends of the openings of the holder portions 101a and 101b. The fixing device 100 for a piping joint could be used for an elbow piping joint 110 of an approximately L-shape, as shown in FIGS. 7 to 9.

Figure 7:
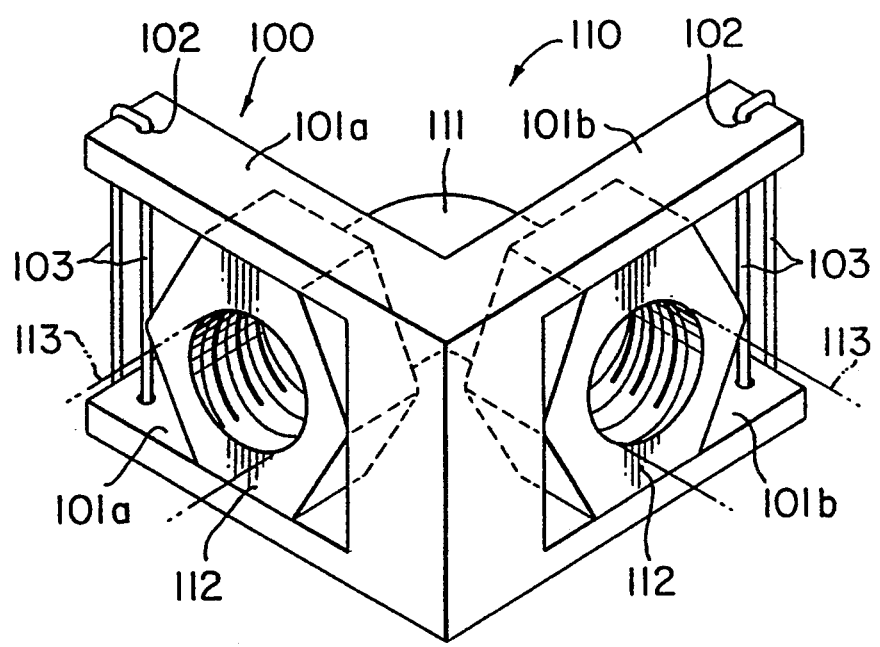
FIG. 7 is a perspective view of the status of the fixing device of FIG. 6 when positioned at a piping joint.
Figure 8:
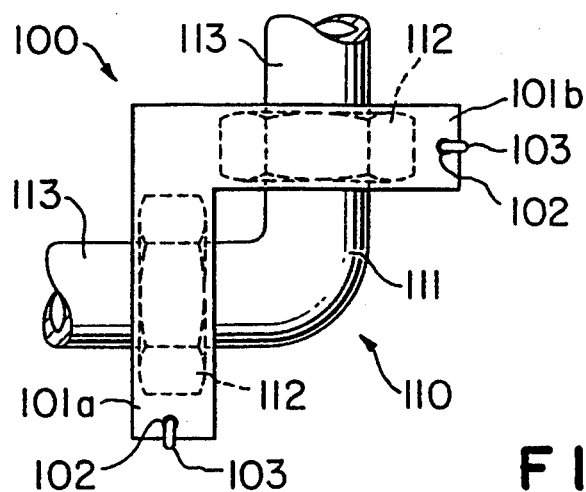
FIG. 8 is a plan view of the piping joint of FIG. 7 and its fixing device.
Figure 9:
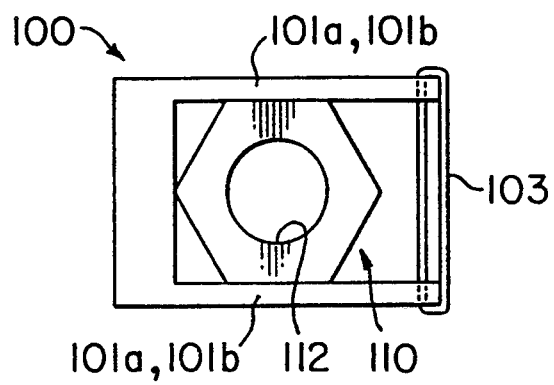
FIG. 9 is a front view of the piping joint of FIG. 7 and its fixing device.

The above piping joint 110 is, as shown in FIGS. 7 and 8, configured of a joint body 111 of a shape formed by bending a tubular pipe into an approximately L-shape, a pipe connection portion provided at each end portion of the joint body 111 with a plurality (such as two, for example) of male screw threads cut into the outer periphery thereof, and nuts 112 each cut with female screw threads in the inner periphery thereof to act as tightening screw bodies threaded onto the outer peripheries of the pipe connection portions.

The configuration is such that, by engaging the nuts 112 with the joint body 111 and tightening them, pipe bodies 113 can be fixed to the joint body 111, as shown in FIG. 8. Note that the joint body 111 and nuts 112 are formed of a plastic that is highly chemicalresistant, such as PVC, and the outer peripheral portion of each of the nuts 112 is configured as a holder portion of a hexagonal shape in the same way an ordinary nut, to allow a spanner or other tool to be used on the outer surface to tighten the nut.

When the piping joint 110 for a piping joint of the above-described configuration is used, the nuts 112 are first tightened onto the joint body 111, a pipe body 113 is connected to each end of the joint body 111 by a nut 112, then the nuts 112 are adjusted in such a manner that they are rotated until their rotational positions approximately match and the holder portions of the nuts 112 are in the same plane.

Note that, with this piping joint 110, the nuts 112 and the joint body 111 are formed of a plastic such as PVC that is more flexible than a metal, so the tightening position of the nuts 112 with respect to the joint body 111 can be adjusted through about one rotation without causing any problems such as leakage.

Next, the fixing device 100 for the piping joint is fitted over the piping joint 110 in such a manner that the holder portions 101a and 101b thereof are positioned to hold the holder portions on the outer surface of each of the nuts 112, then tightening bands 103 or the like are passed through the through holes 102 and tightened. This ensures that the piping joint 110 is prevented from coming out of the fixing device 100 that is holding it.

In this way, the fixing device 100 for the piping joint is attached to the piping joint 110 and rotation of the nuts 112 is restrained by the holder portions 101a and 101b. This can prevent the nuts 112 from loosening as a result of pulsations of the cleaning liquid circulation pumps and other machinery, or as a result of temperature changes or pulsations in the cleaning liquids flowing through the pipe, before such loosening can happen, thus preventing leakage of the cleaning liquids. Therefore, the reliability of the device of the present invention as a cleaning apparatus is further improved.

Figure 10:
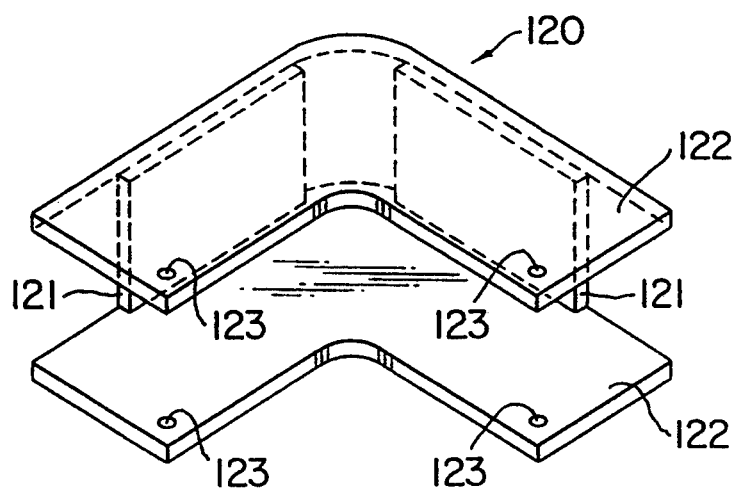
FIG. 10 is a perspective view of a second embodiment of the fixing device for a piping joint.

FIG. 10 shows the configuration of a fixing device 120 for a piping joint in accordance with another embodiment of the present invention. The fixing device 120 for the piping joint of this embodiment is configured such that two L-shaped holding plates 122 are held approximately parallel at a prescribed spacing by two rectangular support portions 121 supported by the inner surfaces thereof. A through hole 123 is provided at each end portion of each holding plate 122, so that tightening bands 103 or the like can be passed therethrough.

The fixing device 120 for the piping joint of the above arrangement is configured in such a manner that the two L-shaped holding plates 122 thereof restrain the two nuts 112, and it has the same effect as the above-described fixing device 100 for the piping joint.

Figure 11:
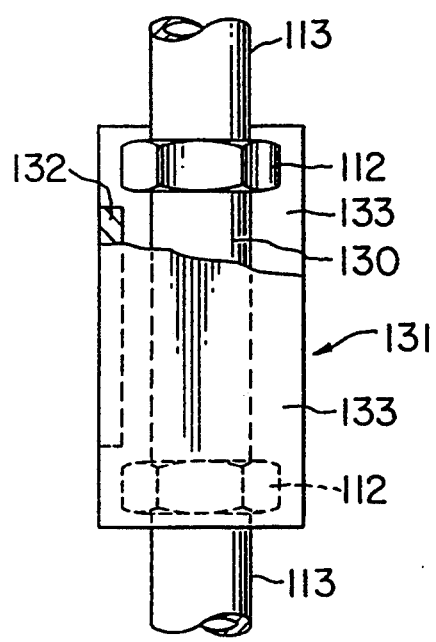
FIG. 11 is a plan view of a third embodiment of the fixing device for a piping joint.
Figure 12:
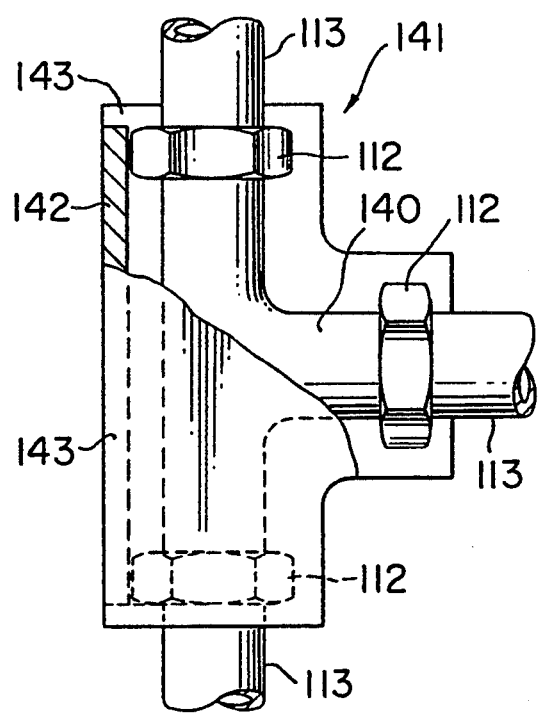
FIG. 12 is a plan view of a fourth embodiment of the fixing device for a piping joint.

The embodiment described above has dealt with an L-shaped piping joint 110, but other embodiments of this fixing device can be applied to other shapes of piping joint, as shown in FIGS. 11 and 12. The fixing device 131 shown in FIG. 11 is designed for a piping joint 130 and piping bodies 113 that are arranged in a straight line. The fixing device 131 for the piping joint has a roughly U-shaped configuration in cross-section such that two rectangular holding plates 133 are held approximately parallel at a prescribed spacing by two rectangular support portions 132. In this case, if, for example, both nuts have right-hand threads, they prevent each other from loosening, so that there is no loosening.

The fixing device 141 shown in FIG. 12 is designed for a three-way piping joint 140 configured in a T-shape. The fixing device 141 for the piping joint has a roughly U-shaped configuration in cross-section such that two T-shaped holding plates 143 are held approximately parallel at a prescribed spacing by a rectangular support portion 142.

With these fixing devices 131 and 141 for piping joints, the insertion of the piping joint 130 or 140 in such a manner that the nuts 112 thereof are restrained between the rectangular holding plates 133 or the T-shaped holding plates 143 ensures that these embodiments have the same loosening-prevention effect as the above-described embodiment.

Figure 13:
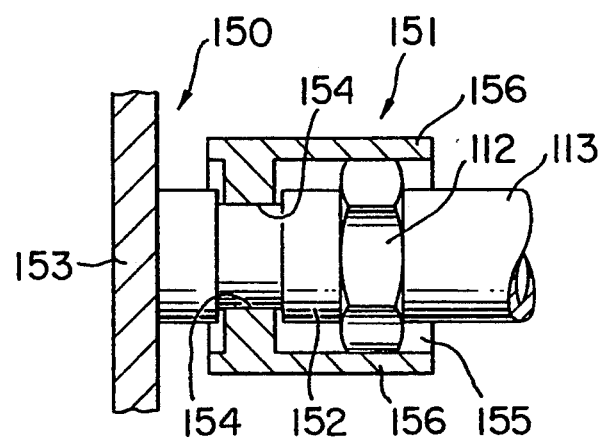
FIG. 13 is a cross-sectional view of a fifth embodiment of the fixing device for a piping joint.

The above embodiments are applied to joints 110, 130, and 140 in which a plurality of nuts 112 are provided, but it can also be applied to the configuration of a fixing device 151 for a piping joint shown in FIG. 13 where there is only one nut 112.

In other words, as shown in FIG. 13, a joint body 152 of a piping joint 150 is configured of a tubular shape and is fixed to a surface such as an outer wall 153 of a tank. A single nut 112 for fixing the pipe body 113 engages with a male screw thread cut into the end of the joint body 152, and a flat-surfaced joint body holder portion (a groove) 154 is formed in the joint body 152. When the joint body 152 is tightened to the outer wall 153, or when the nut 112 is screwed onto the joint body 152, the joint body holder portion 154 holds the joint body 152. A hexagonal portion is formed in the outer surface part of the piping joint 150 to enable the joint body 152 to be tightened by a tool such as a spanner in the ordinary way, so that this portion can be used as a holder portion.

The fixing device 151 for the piping joint of this embodiment has a roughly U-shaped configuration in cross-section such that two holding plates 156 are held apart by a support portion 155, and the joint body holder portion 154 and the nut 112 are restrained thereby. The fixing device 151 for the piping joint configured in this way can also provide the same effect as that of the embodiments described above.

Note that each of the piping joints 110, 130, and 140 can also be configured in such a manner that a flat-surfaced portion similar to the above-described joint body holder portion 154 is formed therein, but this has been omitted from the drawings. Therefore, this flat-surfaced portion can also be held, in the same way as in the above-described fixing device 151 for the piping joint.

FIG. 14 shows the essential portions of a further embodiment of the present invention. The description of the above embodiments dealt with the use of tightening bands 103 to prevent the fixing device 100 coming away from the piping joint 110, for example. However, in a cleaning apparatus for semiconductor wafers, the installation space for piping joints is so cramped, it can be difficult to attach such tightening bands 103. In such a case, as shown with a fixing device 160 for a piping joint shown in FIG. 14, a U-shaped holding portion 161 is formed of a comparatively flexible, elastic material, the shape of the inner surfaces thereof is made to match the outer shape of the nut 112, and projections 162 are formed at the open end portions thereof to prevent removal.

Figure 14A:
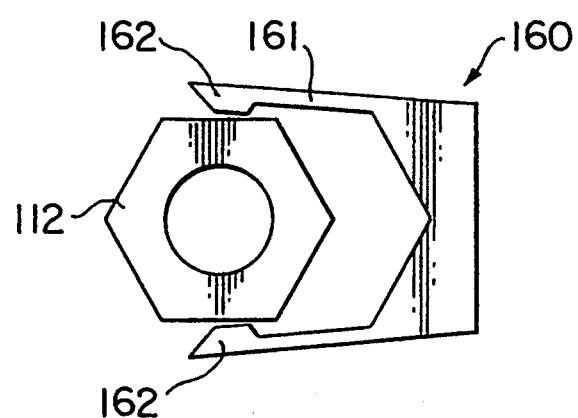
FIGS. 14A and 14B are front views of a sixth embodiment of the fixing device for a piping joint.
Figure 14B:
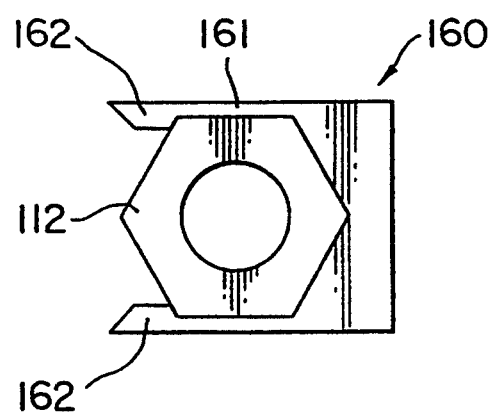

As shown in FIG. 14A, the open end portions of the holding portion 161 are passed over the nut 112 in such a manner that the elasticity thereof enables them to be pushed outward, and then the nut 112 is fitted therein until it is positioned within the holding portion 161 as shown in FIG. 14B. This ensures that there is no need to use tightening bands 103 and the fixing device 160 can be attached in an even easier manner to the piping joint.

As described above, in the fixing device for a piping joint according to the present invention, a tightening screw thread part of a nut or the like of a piping joint can be prevented from loosening as a result of vibration or temperature changes before such loosening happens, and thus the leakage of processing liquids can be prevented.

What is claimed is:

1. A cleaning apparatus comprising:
   a waste liquid sump tank for collecting waste liquid;
   a plurality of processing tanks for containing cleaning liquids, said processing tanks being capable of draining processing liquids to said waste liquid sump tank;
   at least one chemical tank for storing chemicals to be supplied to said processing tanks, said at least one chemical tank having overflow capture means for collecting excess chemicals from said chemical tank which exceed a predetermined level and draining excess chemicals to said waste liquid sump tank;
   an object movement means for conveying an object to be cleaned and for immersing it in said processing tanks;
   a dilutant liquid supply means for supplying dilutant liquid to said waste liquid sump tank in order to dilute waste liquid contained therein;
   a chemical receptacle provided beneath said processing tanks for collecting chemicals escaping therefrom, said receptacle being in communication with said waste liquid sump tank for draining collected chemicals into said sump tank;
   temperature measurement means for monitoring the temperature of chemicals in said waste liquid sump tank; and
   control means for controlling an amount of dilutant liquid supplied to said waste liquid sump tank in response to a temperature measurement signal from said temperature measurement means.

2. The cleaning apparatus claimed in claim 1, wherein liquid level sensors are provided in said chemical storage tanks for monitoring the level of liquid contained therein.

3. The cleaning apparatus claimed in claim 1, wherein said waste liquid sump tank is connectable to a factory liquid waste disposal system for draining of waste liquid thereinto.

4. The cleaning apparatus claimed in claim 1, wherein said processing tanks have overflow tanks which return chemicals which have overflowed to their respective processing tanks.

* * * * *